(12) United States Patent
Donnelly et al.

(10) Patent No.: US 10,207,469 B2
(45) Date of Patent: Feb. 19, 2019

(54) SYSTEMS AND METHODS FOR RAPIDLY FABRICATING NANOPATTERNS IN A PARALLEL FASHION OVER LARGE AREAS

(71) Applicant: University of Houston System, Houston, TX (US)

(72) Inventors: Vincent M. Donnelly, Houston, TX (US); Demetre J. Economou, Houston, TX (US); Siyuan Tian, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 0 days.

(21) Appl. No.: 15/534,312

(22) PCT Filed: Dec. 8, 2015

(86) PCT No.: PCT/US2015/064397
§ 371 (c)(1),
(2) Date: Jun. 8, 2017

(87) PCT Pub. No.: WO2016/094353
PCT Pub. Date: Jun. 16, 2016

(65) Prior Publication Data
US 2017/0361551 A1    Dec. 21, 2017

Related U.S. Application Data

(60) Provisional application No. 62/089,043, filed on Dec. 8, 2014.

(51) Int. Cl.
*B82Y 30/00*    (2011.01)
*B29D 11/00*    (2006.01)
(Continued)

(52) U.S. Cl.
CPC ........ *B29D 11/00375* (2013.01); *B29D 11/00* (2013.01); *B29D 11/00365* (2013.01);
(Continued)

(58) Field of Classification Search
CPC ........ B29D 11/00375; B29D 11/00365; B29D 11/00; B82Y 30/00; G03F 1/20;
(Continued)

(56) References Cited

U.S. PATENT DOCUMENTS 6,051,866 A *  4/2000  Shaw .................. B81C 1/00142
                                                   257/417
8,829,468 B2 *  9/2014  Keller ..................... H01J 27/16
                                                   156/345.48
(Continued)

FOREIGN PATENT DOCUMENTS

JP    2005-347707    12/2005
JP    2006-128376    5/2006
(Continued)

OTHER PUBLICATIONS

Siyuan Tian et al. "Sub-10 nm nanopantography" Applied Physics Letters 107, 193109 (2015), doi: 10.1063/1.4935552, Nov. 13, 2015. pp. 193109-1-193109-4.
(Continued)

*Primary Examiner* — Lan Vinh
(74) *Attorney, Agent, or Firm* — Winstead PC (57) ABSTRACT

Nanopantography is a method for patterning nanofeatures over large areas. Transfer of patterns defined by nanopantography using highly selective plasma etching, with an oxide layer of silicon serving as a hard mask, can improve patterning speed and etch profile. With this method, high aspect ratio features can be fabricated in a substrate with no mask undercut. The ability to fabricate complex patterns using nanopantography, followed by highly selective plasma
(Continued)

etching, provides improved patterning speed, feature aspect ratio, and etching profile.

23 Claims, 3 Drawing Sheets

(51) Int. Cl.
G03F 1/20 (2012.01)
H01J 37/302 (2006.01)
H01J 37/317 (2006.01)
H01L 21/027 (2006.01)

(52) U.S. Cl.
CPC ............ *B82Y 30/00* (2013.01); *G03F 1/20* (2013.01); *H01J 37/3026* (2013.01); *H01J 37/3174* (2013.01); *H01L 21/0274* (2013.01); *H01J 2237/21* (2013.01); *H01J 2237/2811* (2013.01); *H01J 2237/2817* (2013.01); *H01J 2237/31776* (2013.01)

(58) Field of Classification Search
CPC .......... H01J 2237/21; H01J 2237/2811; H01J 2237/2817; H01J 37/3026; H01J 2237/31776; H01J 37/3174; H01L 21/0274
USPC ............... 438/706, 719.723, 736, 769, 770; 216/26, 41, 47
See application file for complete search history.

(56) References Cited

U.S. PATENT DOCUMENTS

| 2003/0020060 | A1* | 1/2003 | Iwasaki ............... B82Y 10/00 257/13 |
|---|---|---|---|
| 2009/0254289 | A1 | 10/2009 | Vivek et al. |
| 2010/0132887 | A2* | 6/2010 | Donnelly ......... B29D 11/00365 156/345.24 |
| 2011/0139748 | A1 | 6/2011 | Donnelly et al. |
| 2013/0337650 | A1* | 12/2013 | Lee ..................... H01L 21/302 438/702 |
| 2015/0118604 | A1* | 4/2015 | Dynes ................. H01L 21/302 430/5 |

FOREIGN PATENT DOCUMENTS

| JP | 2006-294627 | 10/2006 |
|---|---|---|
| JP | 2008-027737 | 2/2008 |

OTHER PUBLICATIONS

J. V. Hermans, D. Laidler, P. Foubert, K. D'Havé, S. Cheng, M. Dusa and E. Hendrickx, in Proceedings of SPIE 8322, Extreme Ultraviolet (EUV) Lithography III, San Jose, California, 2012, edited by Patrick P. Naulleau, Obert R. Wood II, 832202.
A. Mallik, N. Horiguchi, J. Bömmels, A. Thean, K. Barla, G. Vandenberghe, K. Ronse, J. Ryckaert, A. Mercha, L. Altimime, D. Verkest and A. Steegen, in Proceedings of SPIE 9048, Extreme Ultraviolet (EUV) Lithography V, San Jose, California, 2014, edited by Obert R. Wood, Eric M. Panning, 90481R.
R. Ruiz, H. Kang, F. A. Detcheverry, E. Dobisz, D. S. Kercher, T. R. Albrecht, J. J. de Pablo and P. F. Nealey, Science 321, 5891 (2008).
P. Rincon Delgadillo, R. Harukawa, M. Suri, S. Durant, A. Cross, V. R. Nagaswami, D. Van Den Heuvel, R. Gronheid and P. Nealey, in Proceedings of SPIE 8680, Alternative Lithographic Technologies V, San Jose, California, 2013, edited by William M. Tong, Douglas J. Resnick, 86800L.
R. A. Farrell, E. R. Hosier, G. M. Schmid, J. Xu, M. E. Preil, V. Rastogi, N. Mohanty, K. Kumar, M. J. Cicoria, D. R. Hetzer and A. DeVilliers, in Proceedings of SPIE 9051, Advances in Patterning Materials and Processes XXXI, San Jose, California, 2014, edited by Thomas I. Wallow, Christoph K. Hohle, 90510Z.
S.-M. Park, X. Liang, B. D. Harteneck, T. E. Pick, N. Hiroshiba, Y. Wu, B. A. Helms and D. L Olynick, ACS Nano 5, 8523 (2011).
D. J. C. Herr, J. Mater. Res. 26, 122 (2011).
J. G. Son, J.-B. Chang, K. K. Berggren and C. A. Ross, Nano Lett. 11, 5079 (2011).
S. Y. Chou, P. R. Krauss and P. J. Renstrom, J. Vac. Sci. Technol. B 14, 4129 (1996).
F. Hua, Y. Sun, A. Gaur, M. A. Meitl, L. Bilhaut, L. Rotkina, J. Wang, P. Geil, M. Shim, J. A. Rogers and A. Shim, Nano Lett. 4, 2467 (2004).
R. F. Pease and S. Y. Chou, Proceedings of the IEEE 96, 248 (2008).
T. Higashiki, T. Nakasugi and I. Yoneda, J. Micro/Nanolith. MEMS MOEMS. 10, 043008 (2011).
R. S. Dhaliwal, W. A. Enichen, S. D. Golladay, M. S. Gordon and et al., IBM J. Res. Dev. 45, 615 (2001).
E. Platzgummer, in Proceedings of SPIE 7637, Alternative Lithographic Technologies II, San Jose, California, 2010, edited by Daniel J. C. Herr, 763703.
M. J. Wieland, G. de Boer, G. F. ten Berge, M. van Kervinck, R. Jager, J. J. M. Peijster, E. Slot, S. W. H. K. Steenbrink, T. F. Teepen and B. J. Kampherbeek, in Proceedings of SPIE 7637, Alternative Lithographic Technologies II, San Jose, California, 2010, edited by Daniel J. C. Herr, 76370F.
G. de Boer, M. P. Dansberg, R. Jager, J. J. M. Peijster, E. Slot, S. W. H. K. Steenbrink and M. J. Wieland, in Proceedings of SPIE 8680, Alternative Lithographic Technologies V, San Jose, California, 2013, edited by William M. Tong, Douglas J. Resnick, 86800O.
D. Pires, J. L. Hedrick, A. De Silva, J. Frommer, B. Gotsmann, H. Wolf, M. Despont, U. Duerig and A. W. Knoll, Science 328, 732 (2010).
L. L. Cheong, P. Paul, F. Holzner, M. Despont, D. J. Coady, J. L. Hedrick, R. Allen, A. W. Knoll and U. Duerig, Nano Lett. 13, 4485 (2013).
A. W. Knoll, M. Zientek, L. L. Cheong, C. Rawlings, P. Paul, F. Holzner, J. L. Hedrick, D. J. Coady, R. Allen and U. Dürig, in Proceedings of SPIE 9049, Alternative Lithographic Technologies VI, San Jose, California, 2014, edited by Douglas J. Resnick, Christopher Bencher, 90490B.
M. Kaestner and I. W. Rangelow, J. Vac. Sci. Technol. B 29, 06FD02 (2011).
L. Xu, S. C. Vemula, M. Jain, S. K. Nam, V. M. Donnelly, D. J. Economou and P. Ruchhoeft, Nano Lett. 5, 2563 (2005).
L. Xu, A. Nasrullah, Z. Chen, M. Jain, P. Ruchhoeft, D. J. Economou and V. M. Donnelly, Appl. Phys. Lett. 92, 013124 (2008).
H. Shin, W. Zhu, V. M. Donnelly and D. J. Economou, J. Vac. Sci. Technol. A 30, 021306 (2012).
W. Zhu, S. Sridhar, L. Liu, E. Hernandez, V. M. Donnelly and D. J. Economou, J. Appl. Phys. 115, 203303 (2014).
L. Xu, D. J. Economou, V. M. Donnelly and P. Ruchhoeft, Appl. Phys. Lett 87, 041502 (2005).
S. I. Raider, R. Flitsch and M. J. Palmer, J. Electrochem. Soc. 122, 413 (1975).
U. Satoshi, F. Masanori, H. Hideki and N. Naoto, Jpn. J. Appl. Phys. 40, 5312 (2001).
C. Tian, T. Nozawa, K. Ishibasi, H. Kameyama and T. Morimoto, J. Vac. Sci. Technol. A 24, 1421 (2006).
M. A. Lieberman, A. J. Lichtenberg, Principles of Plasma Discharges and Materials Processing, 2nd Edition. (Wiley, New York, 2005) p. 172.
C. Vieu, F. Carcenac, A. Pépin, Y. Chen, M. Mejias, A. Lebib, L. Manin-Ferlazzo, L. Couraud and H. Launois, Appl. Surf. Sci. 164, 111 (2000).
H. Duan, V. R. Manfrinato, J. K. W. Yang, D. Winston, B. M. Cord and K. K. Berggren, J. Vac. Sci. Technol. B 28, C6H11 (2010).
A. E. Grigorescu and C. W. Hagen, Nanotechnology 20, 292001 (2009).
J. Orloff, in Handbook of Charged Particle Optics, Second Edition (CRC Press, 2008), p. 437.

\* cited by examiner

SYSTEMS AND METHODS FOR RAPIDLY FABRICATING NANOPATTERNS IN A PARALLEL FASHION OVER LARGE AREAS

RELATED APPLICATIONS

This application claims the benefit of U.S. Provisional Patent Application No. 62/089,043 filed on Dec. 8, 2014, which is incorporated herein by reference.

STATEMENT REGARDING FEDERALLY SPONSORED RESEARCH

This invention was made with government support under Grant CMMI 1030620 from the National Science Foundation. The government has certain rights in the invention.

FIELD OF THE INVENTION

This invention relates to fabricating nanopatterns over a large area. More particularly, to transferring nanopantography-defined patterns into an underlying material using highly selective plasma etching.

BACKGROUND OF INVENTION

Lithography at the sub-10 nm scale is essential for the fabrication of future integrated circuits, as well as a variety of other nanodevices. Extreme ultraviolet (EUV) lithography, a contender for "next generation lithography," has been delayed due to many issues, including low throughput and high cost. Thus, the search for alternatives to photolithographic techniques continues.

Various alternatives have been explored, such as block copolymer directed self-assembly (DSA), nanoimprint lithography, ion or electron beam proximity or projection lithographies, multiple e-beam lithography, and scanning probe lithography. However, each has disadvantages, such as producing a limited variety of patterns, needing further defect reduction, requiring fragile stencil masks, needing large field optics, Coulomb interaction limitations, resolution limitations, or slow fabrication speeds.

Systems and methods for rapidly fabricating nanopatterns in a parallel fashion over large areas utilizing nanopantography in combination with a second etching step to transfer the nanopattern to the underlying material are discussed herein.

SUMMARY OF INVENTION

In one embodiment, a starting substrate suitable for nanopantography may provide a bottom layer, a masking layer above the bottom layer, a lens layer on top of the masking layer, and an electrode layer above the lens layer. In some embodiments, the masking layer may be a native oxide. This substrate may also provide an array of lenses formed from an array of openings in the electrode and lens layer. A two-step process in which very shallow patterns are defined in an ultrathin mask by nanopantography may be utilized, and then transferred into an underlying material with a second etching step, such as a highly selective plasma etching. For example, a desired pattern is defined in the masking oxide on a silicon substrate using nanopantography with a short exposure time. This pattern is then transferred into the substrate with a second etching step, such as by using a plasma under photo-assisted etching conditions with ion energies that are below the threshold for ion-assisted etching.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

Nanopantography is a patterning method for parallel writing of nanofeatures over large areas. Nanopantography methods are discussed in U.S. Pat. Nos. 7,883,839 and 8,030,620, which are incorporated herein by reference. Nanopantopgraphy allows a plurality of uniform nano-scale features or nanofeatures to be created on a substrate in a substantially parallel manner over large areas. As a nonlimiting example, billions of electrostatic lenses are first fabricated on top of a wafer using conventional semiconductor manufacturing processes. As nonlimiting examples, known photolithography, thin film deposition, and etching methods may be utilized to fabricate arrays of ion-focusing lenses on the substrate or wafer. A broad area, collimated, monoenergetic ion beam is then directed towards the wafer surface. By applying an appropriate DC voltage to the lens array with respect to the wafer, the ion beamlet entering each lens converges to a fine spot focused on the wafer surface that can be 100 times smaller than the diameter of the lens. By controlling the tilt of the substrate with respect to the ion beam, the focused ion beamlets can "write" a desired pattern in a parallel fashion in selected areas of the substrate.

Prior nanopantography can be employed to etch 10 nm-diameter holes in Si by simultaneous exposure to a monoenergetic $Ar^+$ ion beam and $Cl_2$ gas. Throughput is a challenge, however. For example, it may take 30 minutes to etch an array of 50 nm-diameter 100-nm deep holes in Si. Another issue was that etched features showed an unwanted tapered (V-shaped) sidewall at an angle that depended on the numerical aperture of the lens. This also resulted in a size of the etched feature at the surface that was larger than the inherent resolution of the technique.

An improved two-step process is discussed herein in which very shallow patterns defined in an ultrathin mask by nanopantography, and then transferred into an underlying material by highly selective plasma etching, would greatly improve throughput. In some embodiments, the two-step process may reduce the nanopantography process time from 30 minutes to approximately 1-3 minutes.

Highly selective etching of p-type Si in chlorine-containing plasmas can be achieved under photo-assisted etching conditions with ion energies below the ion-assisted etching threshold (~16 eV). This sub-threshold etching was shown to be due to photons (especially in the VUV) emanating from the plasma. Further, there was little or no isotropic etching of p-type silicon under the conditions studied, i.e., no undercut was observed in the etch profiles. With such low ion energy, while maintaining a moderate etching rate of Si (tens of nm/min), it may be possible to use an ultrathin mask, such as the native oxide on Si, to transfer a pattern deep into the Si substrate with minimal or no mask undercut.

Figure 1A:
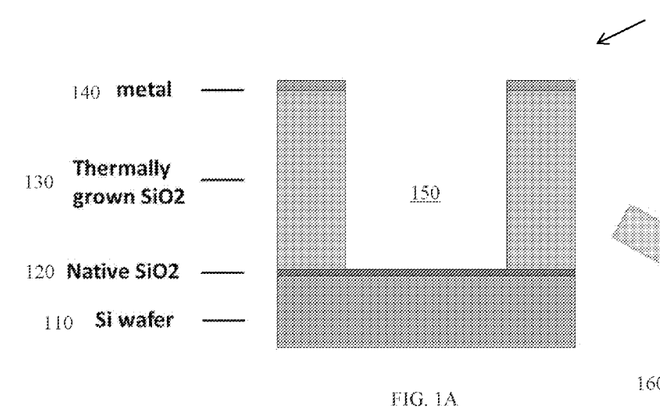
FIGS. 1A-1C show transfer of patterns defined by nanopantography using highly selective plasma etching, more particularly a (a) schematic of an electrostatic lens structure, (b) DC potential applied between a metal and a substrate to focus the ion beamlet to form a shallow pattern by nanopantographic etching, and (c) pattern formed in (b) transferred deep into substrate by highly selective plasma etching using native oxide of the substrate as a hard mask.
Figure 1B:
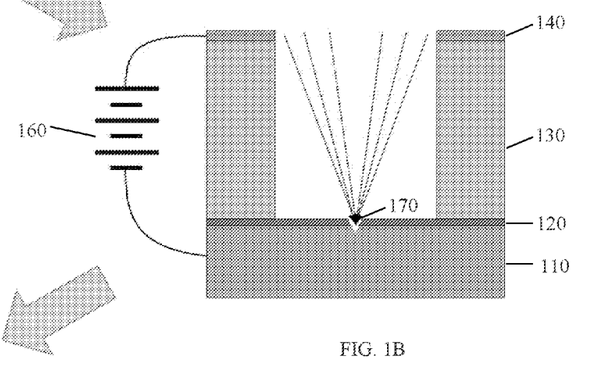
Figure 1C:
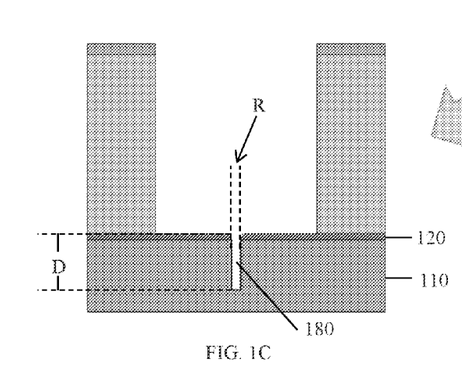

The following demonstrates a new method to transfer nanopantography-defined patterns using highly selective plasma etching. The process flow is schematically depicted in FIGS. 1A-1C. In the first step, a substrate is prepared with the desired layers and the lenses are formed in the substrate utilizing any suitable lithography, deposition, and etching methods. FIG. 1A shows an illustrative example of a close up view of a substrate 100 prepared for nanopantography. The bottom layer 110 may comprise a doped semiconductor material, such as p-Si. In some embodiments, n-Si may be utilized. A masking layer 120, such as $SiO_2$, may be present above or on top of the bottom layer 110. In some embodiments, the masking layer 120 may be a native oxide layer that is serendipitously present, or alternatively, the masking layer may be deposited on the substrate. A lens insulating layer 130 is provided on top of the masking layer 120. This lens layer 130 may be formed from any suitable dielectric material, such as $SiO_2$. A conducting electrode layer 140 may be provided on top of the insulating lens layer 130. This electrode layer 140 may be any suitable conductive material (e.g. Al). Opening 150 is provided in the lens 130 and electrode layers 140. While a single opening 150 is shown, it shall be understood that an array of openings 150 may be present on the substrate, thereby providing the array of lenses for the process. The various layers of the substrate 100 and openings 150 can be formed by any deposition, photolithography, and etching methods that are suitable for producing the desired features, dimension, or the like. In some embodiments, the diameters of the lenses may be nanoscale or equal to or between 3 nm to 1 micron. In some embodiments, the thickness of the layers may be nanoscale or equal to or between 1 nm to 1 micron for the conducting layer, and 10 nm to 10 microns for the insulating layer.

FIG. 1B shows an illustrative example of a step defining a desired pattern on the substrate 100, such as Si wafer 110, using nanopantography with a short exposure time. In some embodiments, the nanopantography exposure time may be equal to or less than 3 minutes. The purpose of this nanopantography step is not to etch deep into bottom layer 110 (e.g. silicon), but to break through the masking layer 120 on top of bottom layer, creating a shallow pattern or mask on the substrate surface. As shown, a voltage 160 is applied across the bottom layer 110 and metal layer 140 during the nanopantography step, which focuses the ion beam 170 at a desired location. The ion beam 170 breaks through the masking layer 120, but does not significantly etch the bottom layer 110. A desired pattern can be formed in the masking layer 120 by tilting substrate 100 in a manner that causes ion beam 170 to trace the desired pattern. For example, the substrate 100 may be tilted off normal with respect to the ion beam axis so that the focal point of the ion beam 170 traces the desired pattern.

In the next step shown in FIG. 1C, the pattern is transferred further into the substrate 100, using plasma etching. As a nonlimiting example, the pattern may be transferred into the substrate utilizing a chlorine plasma under photo-assisted etching conditions with sub-threshold ion energies. In some embodiments, the etching to transfer the pattern further into the substrate may be performed for 7 minutes or less. As a result of the etching, the pattern in the masking layer is transferred further into the bottom layer 110 to completely form an opening or nanofeature 180 with a total depth (D) and radius (R). In some embodiments, the nanopantography step and the second etching to transfer the pattern further into the substrate may be performed 1.5 times faster than a process that relies solely on nanopantography. In some embodiments, the nanopantography step and the second etching to transfer the pattern further into the substrate may be performed 2 times faster than a process that relies solely on nanopantography. In some embodiments, the nanopantography step and the second etching to transfer the pattern further into the substrate may be performed 2.5 times faster than a process that relies solely on nanopantography. In some embodiments, the nanopantography step and the second etching to transfer the pattern further into the substrate may be performed 3 times faster than a process that relies solely on nanopantography.

In some embodiments, the etching may utilize very low ion energy, such as near the ion-assisted etching threshold. As a nonlimiting example, the ion energy may be near 16 eV for silicon. Because of the very low ion energy, the selectivity of etching silicon over silicon dioxide is very high (~120), allowing high aspect ratio features to be formed in the substrate, despite the very thin mask. In some embodiments, the aspect ratio of the features may be 6 or greater. The aspect ratio is a ratio of depth to a size of a feature, such the ratio of depth to diameter of a created opening 180. In some embodiments, the top dimensions (e.g. diameter, length, width) of the opening 180 may be equal to or less than 10 nm.

Nanopantography allows versatile fabrication of nanometer scale pre-selected patterns over large areas. Standard photolithography, thin film deposition, and etching may be used to fabricate arrays of ion-focusing micro-lenses (e.g., small round holes through a metal/insulator structure) on a substrate, such as a silicon wafer. In some embodiments, the substrate may be tilted off normal with respect to the ion beam axis so that the focal points in each hole is laterally displaced, thereby allowing the focused beamlets to be rastered across the hole bottoms. While the examples shown in FIGS. 1A-1C show a single opening 180, during the nanopantography process, the desired pattern is replicated simultaneously in many closely spaced holes over an area limited only by the size of the broad-area ion beam. As such, the nanopantography process can be performed over a large area of the substrate to produce an array of openings or nanofeatures 180. With the proper choice of ions and downstream gaseous ambient, the method can be used to deposit or etch materials.

In some embodiments, nanopantography utilizes a beam of positive ions. Depending on the application, the ions may be any material suitable for deposition, such as, but not limited to, metal ions nickel, cobalt, iron, etc. Moreover, the selected ions may react with the substrate to form new material on the surface of the substrate at the focal points, e.g., oxidation. This reaction may be facilitated by or occur in the presence of a selected gas, for example oxygen.

Furthermore, the process may utilize ions of any material suitable for ion-assisted etching, such as, but not limited to, argon or other rare gases. Similarly, the process may use any gas suitable for etching the substrate, such as chlorine or fluorine containing gases. In another exemplary embodiment, a nano-deposited pattern could be transferred to an underlying substrate by conventional plasma etching or by broad, unfocussed ion beam-assisted etching in the presence of an appropriate gas, such as chlorine for silicon etching, for example. Although ion beams are discussed in the previous exemplary embodiment, the system and method of the present invention may utilize any flux of charged particles. Other exemplary embodiments may utilize electrons, similar to the process of e-beam lithography or e-beam assisted deposition.

As a nonlimiting example, the nanopantography apparatus may be similar to that described by Xu et al., Appl. Phys. Lett. 92, 013124 (2008), except that a new high density inductively coupled plasma source may be installed to achieve higher beam current with a narrower ion angular distribution. Monoenergetic ions may be extracted through a grid using a pulsed plasma technique. Ions may travel to the sample, 60 cm downstream from the extraction grid, drifting through a region that is differentially pumped (pressure=$5 \times 10^{-6}$ Torr during processing) to minimize collisions with the background gas.

A nonlimiting embodiment of a lens structure is shown in FIG. 1A. A substrate 100 may include a bottom layer 110, masking layer 120, a grown oxide or lens layer 130, and a metal layer 140. As a nonlimiting example, a 150 nm sputter deposited Al layer separated from the p-Si substrate by 1000 nm of thermally grown oxide is shown for illustrative purposes. The metal-oxide-silicon structure comprises an electrostatic lens that focuses the ion beamlets entering the structure. As a nonlimiting example, the lenses used as an illustrative example had a diameter of 650 nm and a focal length of 1150 nm (150 nm Al+1000 nm $SiO_2$). The lens array had a pitch of 1.15 µm in both x and y directions, over a $2 \times 5$ mm² area of the sample, which corresponded to a total of 7.5 million lenses. A shallow pattern is formed by nanopantographic etching in the masking layer or native oxide of silicon using a focused $Ar^+$ ion beam and $Cl_2$ gas as shown in FIG. 1B.

During the last step of the lens fabrication process the native oxide layer in the area of interest was completely removed by over-etching, exposing the substrate underneath. After fabrication, lenses were exposed to ambient air, forming a native oxide with a saturated thickness of ~16-20 Å. For such a thin oxide layer, any charge deposited on the surface by the ion beam is expected to leak to the substrate, thus avoiding charging of the oxide, which would lower the energy of the ion beam striking the substrate distorting the ion focus.

Substrates with electrostatic lens arrays fabricated on them may be loaded into a nanopantography processing chamber, and oriented perpendicular to the ion beam direction. The substrate may be electrically connected to ground, while the metal layer on top is DC biased with an optimum voltage to yield the minimum focal spot size. A reactive gas may then be admitted into the processing chamber through a valve, while maintaining a desired pressure in the processing chamber. The nearly monoenergetic ion beam may be extracted from a pulsed inductively coupled plasma using synchronized bias on a boundary electrode. The substrate holder may be tilted independently in two dimensions with a computer controlled accuracy of ±0.015°, allowing writing of any arbitrary, non-reentrant pattern. After etching nanopatterns through the native oxide, to expose the underlying substrate, the sample may then be taken out of the nanopantography apparatus and transferred to the plasma etching reactor. Minimizing exposure to ambient air would minimize oxide regrowth to no more than a few monolayers of oxide on the substrate surface. Plasma etching may be carried out to etch the pattern to a desired depth. As a nonlimiting example, chlorine plasma etching may be utilized for silicon substrates.

As discussed previously above, nanopantography may be utilized to deposit material. In some embodiments, the improved fabrication process may utilize the nanopantography step for depositing material or masking layer that forms a desired pattern. In contrast to the nanopantography to etch layer 120 discussed in reference to FIGS. 1A-1C, a masking layer may be formed by the nanopantography step. In some embodiments, the nanopantography step to produce the masking layer in a desired pattern may cause a material to grow on the bottom layer. In other embodiments, the nanopantography step to produce the masking layer in a desired pattern may cause a reaction with the bottom layer, such as oxidation or the like. As layer 120 may not be present prior to nanopantography in such an alternative process, the masking materials would form in the spots where deposited by nanopantography. As a nonlimting example, masking material may be deposited by nanopantography in the shape of a circle on substrate 110. Instead of creating an opening where the ion beam 170 is shown in FIG. 1B, in the alternative process, the nanopantography would deposit the masking material only where the ion beam is focused. A second etching to transfer the pattern into the bottom layer would remove the exposed portions of substrate 110 to form a pillar in the shape of the circle. Instead of forming the opening 180 with a diameter (R) as shown in FIG. 1C, this alternative process would allow a pillar with a diameter (R) to be formed. Similar to the process discussed for FIGS. 1A-1C that utilizes the nanopantography for etching a desired pattern, the alternative process can deposit materials during the nanopantography step in any desired pattern.

In addition, depending on the desired application, exemplary embodiments of the present process may utilize simultaneous or sequential deposition of multiple metals of controlled composition. Other exemplary embodiments may utilize small metal catalyst particles, such as nickel, to grow orderly arrays of precisely positioned carbon nanotubes, for example. The process may also allow for alternating between different gasses, ions, and/or precursors to form multilayer structures. In other exemplary embodiments, the focused deposition could be followed by an unfocused "etch back" process to clear footers and other thinner imperfections around deposits and improve resolution.

One exemplary embodiment may sequentially combine the etching and depositions steps. For example, nano-holes could be etched into a substrate and then without removing the substrate from the processing chamber, the etching gas could be turned off and power could be supplied to a target electrode to focus a deposit into the holes in a self-aligned manner. In another exemplary embodiment, the size of nano deposits with Gaussian-shaped profiles may be reduced. This reduction may be accomplished by an etch-back step with an unfocussed or focused ion beam. The etch-back step may be performed in the presence of a gas that would selectively etch the nano-deposit and not the substrate. This step may remove the edges of the deposits and thus reduce their size.

EXPERIMENTAL EXAMPLE

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

As discussed previously above, in a nonlimiting experimental example, Si substrates with the electrostatic lens arrays fabricated on them may be processed for a short time (e.g., 1-3 min) by nanopantography to define a pattern in the native oxide on silicon. This pattern may then be transferred into the Si substrate using a chlorine plasma under photo-assisted etching conditions with sub-threshold ion energies.

As a nonlimiting example, Si substrates with the electrostatic lens arrays fabricated on them were loaded into the nanopantography processing chamber, and oriented perpendicular to the ion beam direction. The Si substrate was electrically connected to ground, while the Al layer on top was DC biased with the optimum voltage of 96.8V, determined by experiments and simulations to yield the minimum focal spot size of $Ar^+$, with a measured energy of 107 eV. $Cl_2$ was then admitted into the processing chamber through a leak valve such that the pressure in the processing chamber was $3.0 \times 10^{-5}$ Torr. (The base pressure was $1.0 \times 10^{-7}$ Torr.) The nearly monoenergetic (3 eV FWHM) $Ar^+$ beam was extracted from a pulsed inductively coupled plasma using synchronized bias on a boundary electrode. The ion beam current density at the sample location was measured to be 1 $\mu A/cm^2$. The substrate holder could be tilted independently in two dimensions with a computer controlled accuracy of $\pm 0.015°$, allowing writing of any arbitrary, non-reentrant pattern. After etching nanopatterns through the native oxide, to expose the underlying silicon, the sample was taken out of the nanopantography apparatus and was quickly transferred to the plasma etching reactor. During the less than 5 minute exposure to ambient air, an oxide of no more than a few monolayers thick is expected to regrow on the silicon surface.

Chlorine plasma etching was carried out in a Tokyo Electron Radial Line Slot Antenna (RLSA©) reactor. The 1,500 W microwave excited plasma has a very low electron temperature ($T_e \sim 1$ eV at 5 mTorr) above the wafer, as determined by Langmuir probe analysis. With no RF bias on the electrically floating wafer stage, the ion bombardment energy is $\sim 5T_e$, and therefore well below the threshold for ion-assisted etching of silicon.

Silicon samples were mounted, using Fomblin© oil, at the center of a 200 mm diameter silicon wafer that was positioned 40 cm below the quartz window through which the microwaves were fed. Samples with a lens structure fabricated on them, but not exposed to nanopantography, were used to measure the Si etching rate and ascertain the plasma etch resistance of the native oxide of silicon under the chosen plasma conditions. An induction period of about 7 minutes was observed before Si etching commenced, corresponding to breaking through the native oxide. After this induction period, silicon etched at a constant rate of ~30 nm/min. After plasma etching, samples were cleaved and examined by scanning electron microscopy (SEM).

Figure 2A:
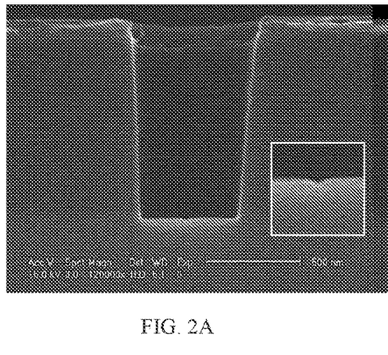
FIGS. 2A-2B show a hole etched in silicon using the present method of pattern transfer (after plasma etching, hole surface diameter and depth are 15 nm and 80 nm respectively)
Figure 2B:
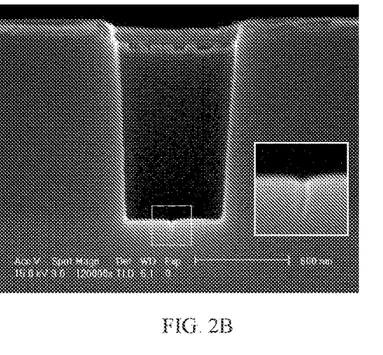
Figure 3:
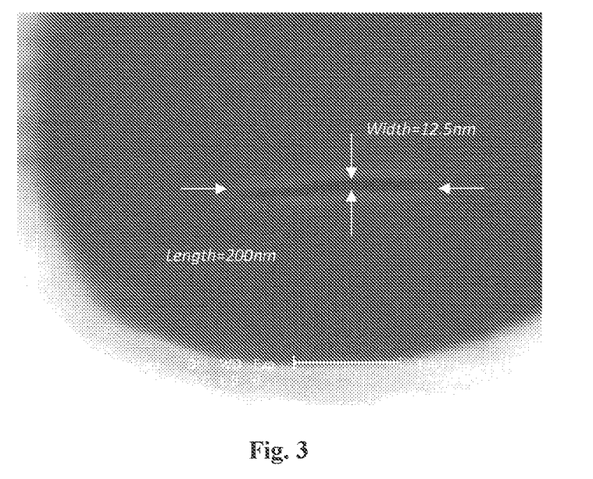
FIG. 3 shows a 12.5 nm-wide, 200 nm-long line etched in silicon using the present method of pattern transfer (depth was 80 nm (aspect ratio >6). Scale bar is 100 nm)

A feasibility experiment was carried out by forming a hole at the center of the bottom of each lens (FIGS. 2a-2b). The focusing voltage was set at 96.8 V. For a nanopantography process time of 3 minutes, the silicon was etched less than 10 nm-deep (FIG. 2a). After chlorine plasma etching for 7 min, using the parameter values given above, the hole was 80 nm deep, while the rest of Si surface was successfully protected by the native oxide (FIG. 2b). Lines were also written by nanopantograhy, using the optimum focusing voltage of 96.8 V and a 50 s dwell time per exposure step. The exposure step size was 3.4 nm, achieved by tilting the sample stage 0.17°/step. The equivalent writing speed is 4.1 nm/min. A 200 nm-long trench with 12.5 nm width was obtained using chlorine plasma etching after nanopantography patterning (FIG. 3). The depth of the Si trench was ~80 nm, resulting in an aspect ratio (depth/width) of 6.4.

Figure 4:
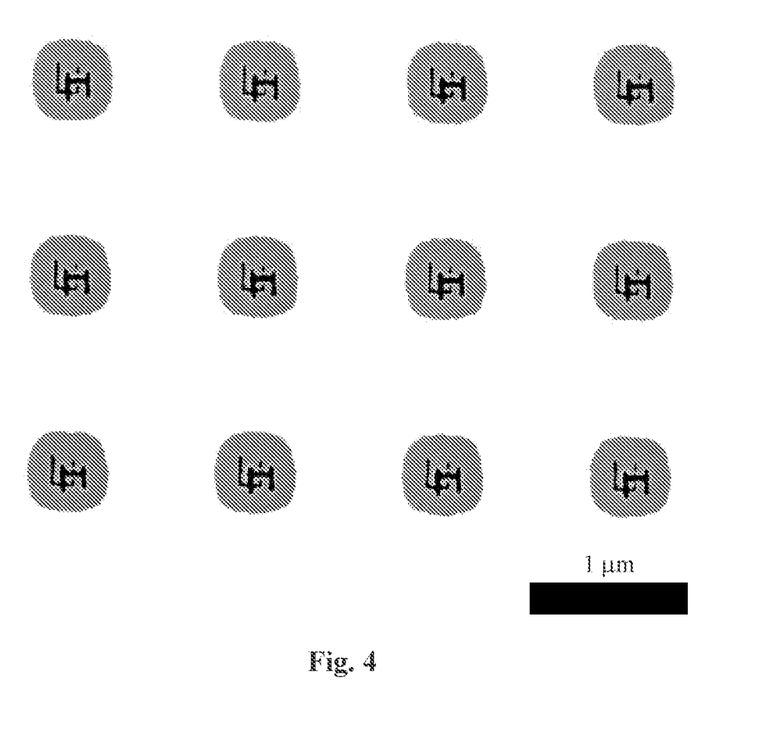
FIG. 4 shows the interlocking "UH" logo etched in silicon using the present method of pattern transfer.

Finally, interlocking "UH" logos were written over 225 nm×250 nm areas with an exposure step size of 3.4 nm and dwell time of 50 s (FIG. 4). The thinnest line near the crossing point of the right vertical line of letter U and the horizontal line of letter "H" is ~10 nm-wide.

Using highly selective chlorine plasma etching to transfer patterns, defined by nanopantography, results in improvement in both writing speed and feature resolution. Instead of etching a 100 nm-deep feature in Si, only a 1-2 nm of $SiO_2$ needs to be removed and this reduces the nanopantography process time from 30 minutes to approximately 1-3 minutes. In addition, the resolution is improved because a much thinner layer of material has to be removed by nanopantography. With the previous method of etching trenches by nanopantography with no plasma for pattern transfer, the best resolution achievable was 15 nm full width at half maximum (FWHM) and about 30 nm at the top of the feature. With the nanopantography with plasma etching for pattern transfer discussed herein, the best resolution achieved so far was about 12 nm at the top of a trench or nearly 3× better resolution. In some embodiments, with the improved methods discussed, the resolution achievable for a nanofeature is 15 nm FWHM or less. Because the ion beam focus spot is only 6-7 nm (based on the smallest feature obtained, and about equal to a FWHM of 8 nm found in simulations for this lens diameter and numerical aperture, NA=0.28), the depth of focus (DOF) of the beam is shallow, i.e., only 20 nm. Etching beyond the range of the DOF would create features larger than the focal spot size, degrading the inherent resolution. By reducing the thickness to a few nanometers, the etched layer completely falls into the DOF of the ion beamlets, resulting in better resolution.

In summary, transfer of patterns defined by nanopantography, was demonstrated using highly selective chlorine plasma etching. The native oxide of silicon served as a hard mask, due to the high selectivity of chlorine plasma etching with sub-threshold ion bombardment energies. High aspect ratio (at least 6) nanopatterns with ~10 nm openings were fabricated in silicon with no mask undercut. An array of "UH" logos with ~10 nm-wide nanoletters was fabricated to demonstrate the ability to fabricate arbitrary, non-reentrant patterns, using nanopantography, followed by highly selective plasma etching. The smallest features fabricated so far by this method were 6 nm diameter holes.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

What is claimed is:

1. A method for creating an array of substantially uniform features in a substrate, the method comprising the steps of:
    processing a substrate to provide a plurality of electrostatic lenses,
        wherein the substrate comprises a bottom layer of semiconductive material, a lens layer above the bottom layer, and an electrode layer above the lens layer, and
        each of the plurality of electrostatic lenses comprises an opening in the electrode layer and the lens layer;
    performing nanopantography on the substrate for a first predetermined amount of time to generating a masking layer with a pattern on the bottom layer, wherein the nanopantography generates the masking layer by utilizing the electrostatic lenses to generate the pattern with an ion beam; and
    performing a second etching on the substrate to transfer the pattern in the masking layer produced by the nanopantography step to the bottom layer to form an array of nanofeatures.

2. The method of claim 1, wherein the masking layer is a native oxide of the bottom layer.

3. The method of claim 1, wherein the substrate is tilted off a normal axis with respect to an ion beam axis to form the pattern in the masking layer.

4. The method of claim 1, wherein a processing time for the nanopantography step is equal to or less than 3 minutes.

5. The method of claim 1, wherein a resolution of at least one nanofeature from the array of nanofeatures is 15 nm full width at half maximum (FWHM) or less.

6. The method of claim 1, wherein ion energies during the plasma etching step are below the ion-assisted etching threshold for the masking layer.

7. The method of claim 1, wherein an aspect ratio of at least one nanofeature from the array of nanofeatures is 6 or greater.

8. The method of claim 1, wherein at least one nanofeature from the array of nanofeatures has top dimensions equal to or less than 10 nm.

9. The method of claim 1, wherein the step of performing nanopantography etches the pattern into the masking layer.

10. The method of claim 1, wherein the step of performing nanopantography causes a material to grow in the pattern defined by the masking layer.

11. The method of claim 1, wherein the second etching is a highly selective plasma etching.

12. The method of claim 11, wherein the second etching is a chlorine plasma etching.

13. The method of claim 11, wherein second etching is achieved under photo assisted etching conditions with ion energies below the ion-assisted etching threshold of the masking layer.

14. The method of claim 1, wherein the masking layer is a material that is deposited by the step of performing nanopantography.

15. The method of claim 14, wherein the masking layer is formed by a reaction with the bottom layer.

16. The method of claim 15, wherein the reaction is oxidation of the bottom layer.

17. A substrate with an array of nanofeatures, the substrate comprising:
    a bottom layer of semiconductive material;
    a masking layer on top of the bottom layer;
    a lens layer on top of the masking layer;
    an electrode layer above the lens layer;
    a plurality of lens openings in the electrode layer and the lens layer, wherein each of the plurality of lens openings is a nanoscale sized opening, and each of the plurality of lens openings allow an ion beam to be focused when a voltage is applied across the electrode layer and the bottom layer; and
    an array of nanofeatures in the masking layer and the bottom layer, wherein each of the array of nanofeatures comprises
        an opening in a first region in the masking layer patterned using nanopantography, wherein the nanopantography writes a pattern in the masking layer by utilizing the electrostatic lenses to focus and write the pattern with an ion beam, and
        a second region in the bottom layer formed by a second etching that transfers a pattern of the masking layer produced by the nanopantography step into the bottom layer.

18. The substrate of claim 17, wherein the masking layer is a native oxide layer of the bottom layer.

19. The substrate of claim 17, wherein aspect ratio of at least one nanofeature from the array of nanofeatures is 6 or greater.

20. The substrate of claim 17, wherein a resolution of at least one nanofeature from the array of nanofeatures is 15 nm full width at half maximum (FWHM) or less.

21. The substrate of claim 20, wherein each nanofeature in the array of nanofeatures are not undercut.

22. The substrate of claim 20, wherein each nanofeature in the array of nanofeatures do not taper.

23. The substrate of claim 20, wherein the array of nanofeatures are filled with material deposited by nanopantography in a self-aligned manner.

\* \* \* \* \*